United States Patent
Schulze et al.

(10) Patent No.: US 9,312,120 B2
(45) Date of Patent: Apr. 12, 2016

(54) METHOD FOR PROCESSING AN OXYGEN CONTAINING SEMICONDUCTOR BODY

(71) Applicant: Infineon Technologies AG, Neubiberg (DE)

(72) Inventors: Hans-Joachim Schulze, Taufkirchen (DE); Helmut Oefner, Zorneding (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/473,890

(22) Filed: Aug. 29, 2014

(65) Prior Publication Data

US 2016/0064206 A1 Mar. 3, 2016

(51) Int. Cl.
| | | |
|---|---|---|
| H01L 21/02 | (2006.01) | |
| H01L 21/324 | (2006.01) | |
| H01L 21/265 | (2006.01) | |
| H01L 29/16 | (2006.01) | |
| H01L 29/36 | (2006.01) | |
| H01L 21/66 | (2006.01) | |

(52) U.S. Cl.
CPC ...... *H01L 21/02008* (2013.01); *H01L 21/0203* (2013.01); *H01L 21/02436* (2013.01); *H01L 21/26506* (2013.01); *H01L 21/324* (2013.01); *H01L 22/26* (2013.01); *H01L 29/16* (2013.01); *H01L 29/36* (2013.01)

(58) Field of Classification Search
CPC .............. H01L 21/3225; H01L 21/324; H01L 21/3221; H01L 29/32; H01L 21/76243; H01L 21/02008; H01L 21/0203; H01L 21/02436; H01L 21/26506; H01L 29/16; H01L 29/36; H01L 22/26
See application file for complete search history.

(56) References Cited

U.S. PATENT DOCUMENTS

| | | | |
|---|---|---|---|
| 6,197,606 B1 | 3/2001 | Polignano et al. | |
| 6,342,725 B2 * | 1/2002 | Falster | H01L 27/1203 257/347 |
| 2009/0305486 A1 * | 12/2009 | Schulze | H01L 21/02381 438/478 |
| 2011/0042791 A1 * | 2/2011 | Schulze | H01L 21/263 257/655 |
| 2011/0049664 A1 * | 3/2011 | Kurita | H01L 21/02378 257/447 |
| 2013/0270681 A1 * | 10/2013 | Park | H01L 21/2253 257/618 |

FOREIGN PATENT DOCUMENTS

WO 2007085387 A1 8/2007

OTHER PUBLICATIONS

Falster, R., "Orthoganal Defect Solutions for Silicon Wafers: MDZ and Micro-Defect Free Crystal Growth," Future Fab International, Feb. 2, 2002, pp. 1-7, Issue 12.

* cited by examiner

*Primary Examiner* — Yasser A Abdelaziez
*Assistant Examiner* — Farun Lu
(74) *Attorney, Agent, or Firm* — Slater & Matsil, L.L.P.

(57) ABSTRACT

A method for processing a semiconductor body is disclosed. In an embodiment, the method includes reducing an oxygen concentration in a silicon wafer in a first region adjoining a first surface of the silicon wafer by a first heat treatment, creating vacancies in a crystal lattice of the wafer at least in a second region adjoining the first region by implanting particles via the first surface into the wafer and forming oxygen precipitates in the second region by a second heat treatment.

25 Claims, 3 Drawing Sheets

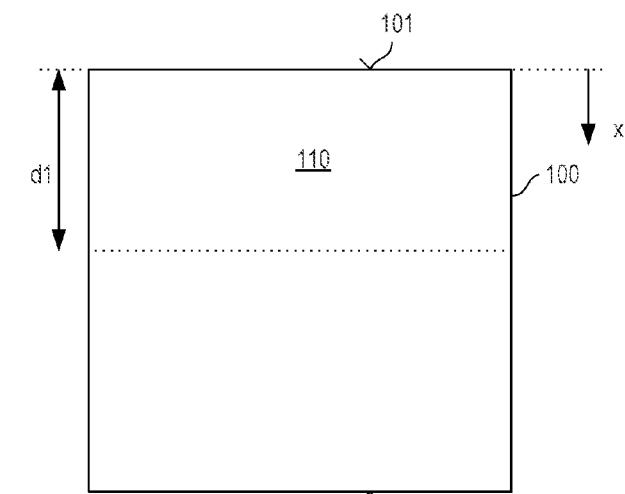
FIG 1
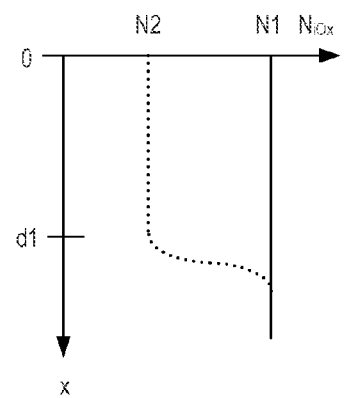
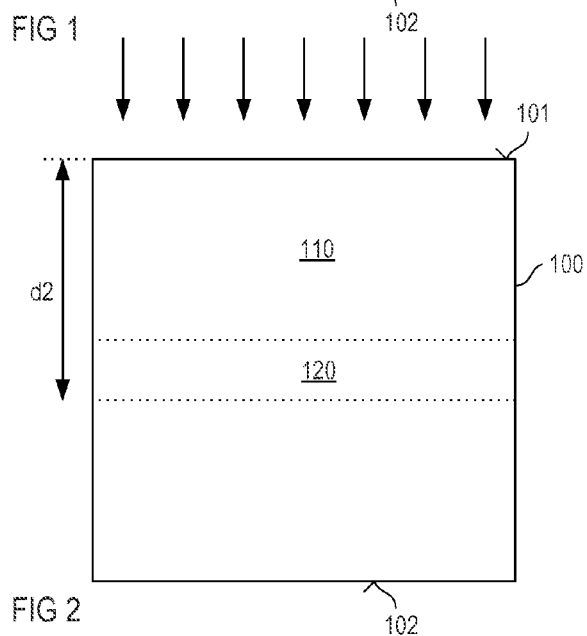
FIG 2
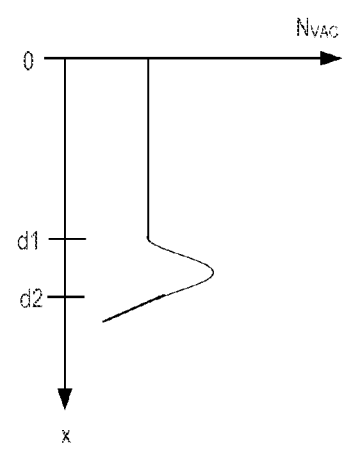
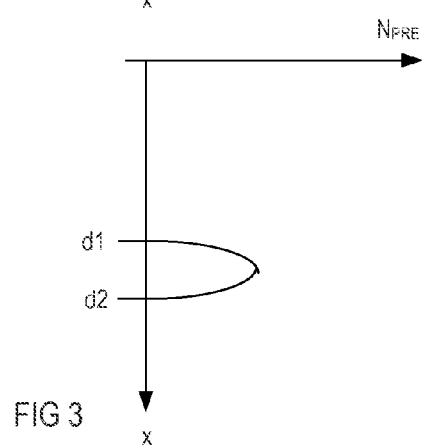
FIG 3

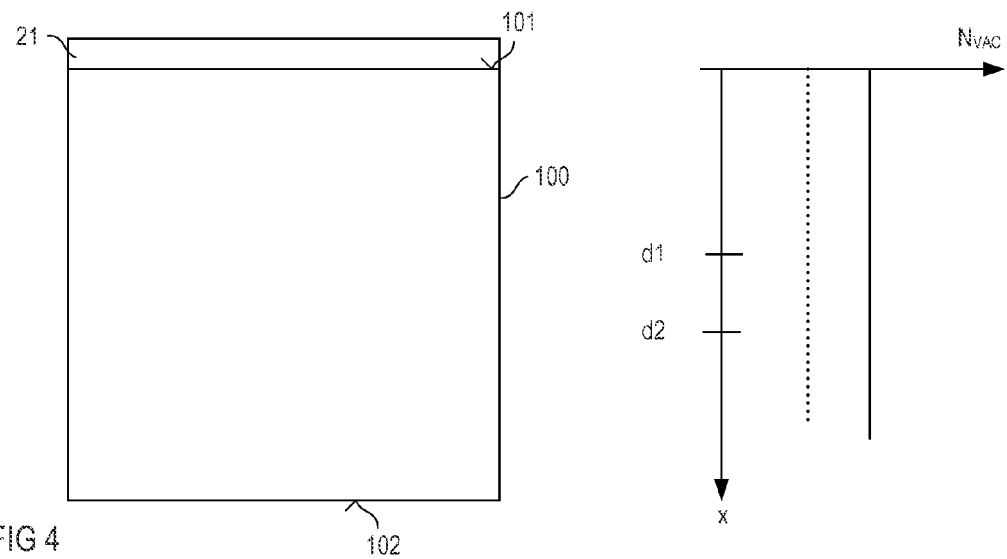
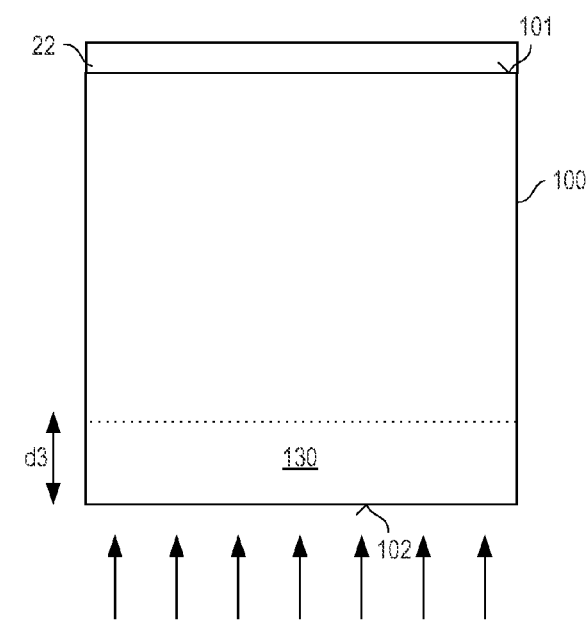

US 9,312,120 B2

1

METHOD FOR PROCESSING AN OXYGEN CONTAINING SEMICONDUCTOR BODY

TECHNICAL FIELD

This disclosure in general relates to a method for processing an oxygen containing semiconductor body and, in particular, for producing a denuded zone and a gettering zone in a silicon semiconductor body.

BACKGROUND

Today, monocrystalline silicon is the most widely used semiconductor material for producing semiconductor devices and integrated circuits. One method for producing a silicon single crystal is to grow a crystal from molten silicon according to the Czochralski (CZ) method. By virtue of the specific growth process, such silicon (which will be referred to as CZ silicon in the following) is supersaturated with oxygen. That is, the silicon includes interstitial oxygen in a typical concentration of higher than $5E17$ $cm^{-3}$.

Thermal treatment cycles which are typically employed in the fabrication of electronic devices can cause the precipitation of oxygen in silicon wafers which are supersaturated in oxygen. Depending upon their location in the wafer, oxygen precipitates can be harmful or beneficial. Oxygen precipitates, which may include oxygen agglomerates and oxygen-vacancy agglomerates, may induce the formation of defects, such as dislocations or stacking faults. These defects, in turn, may degrade the performance of semiconductor devices if these defects occur in the active areas of the devices. However, oxygen precipitates located distant to the active area (in the bulk of the wafer) are capable of trapping undesired metal impurities that may come into contact with the wafer in the fabrication of electronic devices. The use of oxygen precipitates located in the bulk of the wafer to trap metals is commonly referred to as internal or intrinsic gettering.

It is desirable to produce a silicon wafer having a zone or region near the surface of the wafer which is free of oxygen precipitates (commonly referred to as a "denuded zone" or a "precipitate free zone"), and a gettering zone adjoining the denuded zone. It is further desirable to precisely control the thickness of the denuded zone in this process.

SUMMARY

One embodiment relates to a method. The method includes reducing an oxygen concentration in a silicon wafer in a first region adjoining a first surface of the silicon wafer by a first heat treatment, creating vacancies in a crystal lattice of the wafer at least in a second region adjoining the first region by implanting particles via the first surface into the wafer, and forming oxygen precipitates in the second region by a second heat treatment.

One embodiment relates to a semiconductor wafer, which includes a first surface; a first region, a second region, and a third region. The first region adjoins the first surface, and the second region is between the first region and the third region. A minimum concentration of oxygen precipitates in the third region is higher than a maximum concentration of oxygen precipitates in the first region, and a minimum concentration of oxygen precipitates in the second region is higher than a maximum concentration of oxygen precipitates in the third region.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIG. 1 illustrates a vertical cross sectional view of one section of a semiconductor wafer, and the interstitial oxygen concentration in a first region of the semiconductor wafer before and after a first heat treatment;

FIG. 2 shows a vertical cross sectional view of a section of the semiconductor wafer, and a vacancy concentration in the semiconductor wafer in a first and a second region of the wafer after implanting particles into a first surface;

FIG. 3 illustrates an oxygen precipitate concentration in the semiconductor wafer obtained by a second heat treatment;

FIG. 4 shows a vertical cross sectional view of a section of the semiconductor wafer, and a vacancy concentration in the semiconductor wafer before and after driving interstitial silicon from a first surface into the semiconductor wafer;

FIG. 5 shows a vertical cross sectional view of the semiconductor wafer during a process step in which vacancies are generated in the semiconductor wafer in a region of a second surface of the semiconductor wafer.

DETAILED DESCRIPTION OF ILLUSTRATIVE EMBODIMENTS

Figure 6:
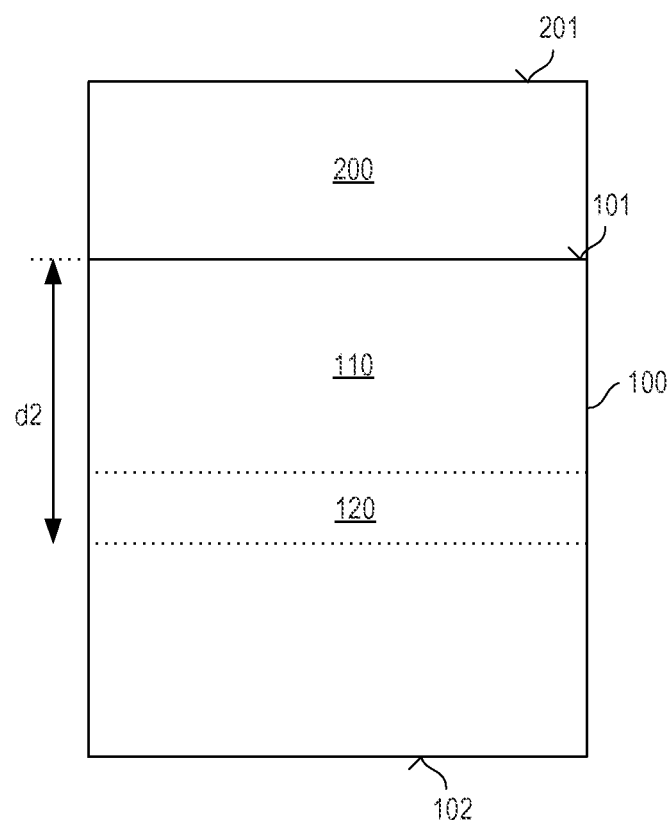
FIG. 6 shows a vertical cross sectional view of a section of the semiconductor wafer after forming an epitaxial layer on a first surface of the semiconductor wafer.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIG. 1 shows a vertical cross sectional view of one section of a semiconductor wafer 100. Referring to FIG. 1, the semiconductor wafer 100 includes a first surface 101, and a second surface 102 opposite the first surface 101. According to one embodiment, the semiconductor wafer 100 is a silicon wafer, in particular, a silicon wafer produced in accordance with the Czochralski (CZ) method. That is, the semiconductor wafer 100 has been cut off from a single crystal (ingot) grown from molten silicon according to the CZ method.

The semiconductor wafer 100, in particular when produced in accordance with the CZ method, includes interstitial oxygen. The diagram shown in FIG. 1 next to the illustration of the semiconductor wafer 100 schematically illustrates the oxygen concentration along a vertical direction x of the semiconductor wafer 100 and beginning at the first surface 101. The "vertical direction" of the semiconductor wafer 100 is a direction perpendicular to the first surface 101 (and the second surface 102).

The solid line in the diagram shown in FIG. 1, represents the interstitial oxygen concentration in the semiconductor wafer 100 after cutting off the wafer from an ingot. A maximum interstitial oxygen concentration N1 is, for example, higher than $6E17$ $cm^{-3}$. In FIG. 1, only the oxygen concentration in the region below the first surface 101 is illustrated.

The presence of interstitial oxygen in those regions of the semiconductor wafer 100 in which semiconductor devices are integrated may degrade the performance of these semiconductor devices. The term "semiconductor devices" as used herein includes any kind of integrated semiconductor device such as, for example, a transistor (e.g., a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or the like), a diode, a storage cell, or a combination of identical or different semiconductor devices. Such combination of different semiconductor devices may also be referred to as integrated circuit.

The presence of oxygen in the semiconductor wafer 100 may degrade the performance of semiconductor devices which are integrated in the wafer, that is, which have active device regions integrated in the semiconductor wafer. Those semiconductor devices may be integrated in the wafer 100 after process sequences explained below. Referring to the explanation below, those process sequences include heat treatments. Those heat treatments may be part of a process for forming semiconductor devices. This is explained in further detail below. Interstitial oxygen may precipitate (form oxygen precipitate) which may result in crystal defects in the semiconductor wafer 100, such as dislocations or stacking faults. These defects may degrade the performance of the semiconductor devices. On the other hand, there may be regions of the semiconductor wafer 100 where oxygen precipitates are welcome because of their capability of gettering impurities such as, for example, heavy metal atoms that may be introduced into the semiconductor wafer 100 during process sequences for integrating the semiconductor devices in the semiconductor wafer 100.

One embodiment of a method for producing a first region which is substantially free of oxygen precipitates (commonly referred to as "denuded zone" or a "precipitate free zone"), and an oxygen precipitates containing gettering zone adjacent the denuded zone is explained below.

Referring to FIG. 1, the method includes reducing an oxygen concentration in the silicon wafer 100 in a first region 110 adjoining the first surface 101 by a first heat treatment. The dotted line in the diagram shown in FIG. 1 schematically illustrates the interstitial oxygen concentration $N_{iOx}$ in the semiconductor wafer 100 in a region below the first surface 101 after the first heat treatment. Reducing the oxygen concentration includes reducing the oxygen concentration to below the oxygen concentration before the first heat treatment and, in particular, to below a predefined maximum oxygen concentration N2. According to one embodiment, reducing the oxygen concentration includes reducing the oxygen concentration to below 5E17 cm$^{-3}$ or even to below 4E17 cm$^{-3}$. In FIG. 1, reference character 110 denotes a first region of the semiconductor wafer 100 in which the oxygen concentration after the first heat treatment is below the predefined maximum concentration N2. This first region 110 adjoins the first surface 101. A depth d1 of this first region 110 is, for example about 10 micrometers (μm).

The maximum oxygen concentration N2 in the first region 110, and the depth d1 of the first region 110 can be adjusted by at least one of the temperature and the duration of the first heat treatment. According to one embodiment, the temperature in the first heat treatment is higher than 1000° C., and a duration of the first heat treatment is longer than 1 hour and, in particular, longer than 4 hours. In particular, the depth d1 of the first region 110 can be adjusted by one of the temperature and the duration of the first heat treatment. In general, at a given duration of the first heat treatment, the depth d1 increases as the temperature increases. Further, at a given temperature of the first heat treatment, the depth d1 increases as the duration of the first heat treatment increases. According to one embodiment, the first heat treatment is carried out in an inert atmosphere such as, for example, a nitrogen containing or argon containing atmosphere. According to another embodiment, the first heat treatment is carried out in oxygen containing atmosphere. In this case, the maximum temperature in the first heat treatment may be below 1150° C. so that the solid solubility limit is below 4E17 cm$^{-3}$. In general, the solubility limit increases as the temperature increases, by limiting the temperature to below 1150° C. the diffusion of oxygen into the wafer can be limited.

Referring to FIG. 2, the method further includes creating vacancies in the crystal lattice of the semiconductor wafer 100 at least in a second region 120 adjoining the first region 110. Creating the vacancies in the crystal lattice includes implanting particles via the first surface 101 into the semiconductor wafer 100 and, in particular, into the second region 120. The implanted particles are, for example, protons, or helium atoms.

The diagram shown in FIG. 2 schematically illustrates the vacancy concentration $N_{VAC}$ after implanting the particles via the first surface 101. Referring to this diagram, implanting the particles via the first surface 101 may not only include creating vacancies in the second region 120 adjoining (below) the first region 110, but also in the first region 110. However, according to one embodiment, a maximum of the vacancy concentration is in the second region 120.

According to one embodiment, the vacancy concentration $N_{VAC}$ in the second region 120, after implanting the particles is between 1E17 cm$^{-3}$ and 1E19 cm$^{-3}$. The vacancy concentration may be adjusted by suitably adjusting the implantation dose of the implanted particles. According to one embodiment, the implantation dose is selected from a range of between 5E13 cm$^{-2}$ and 1E15 cm$^{-2}$.

In FIG. 2, d2 denotes a distance between the first surface 101 and a border of the second region 120 facing away from the first region 110. d2 substantially corresponds to a distance between the first surface 101 and an end-off-range of the particle implantation. The "end-off-range" of the particle implantation is the range in which the majority of the particles, after having traveled through the semiconductor wafer 100, come to rest. In the crystal lattice, vacancies are generated between the first surface 101 and the end-off-range. The particles may be implanted with only one implantation energy, or with two or more different implantation energies. In the latter case, the distance d2 between the first surface 101 and the border of the second region 120 is defined by the end-off-range of the particle implantation that includes the highest of the two or more implantation energies.

The second region 120, is the region adjoining the first region 110, and including vacancies, but not including an oxygen concentration below the predefined maximum concentration N2 which is present in the first region 110. A width of the second region 120, that is, a dimension of the second region 120 in a vertical direction of the semiconductor wafer 100 is dependent on how deep the particles are implanted into the wafer, and on how deep the first region 110 extends into the semiconductor wafer 110. Substantially, the width of the second region 120 is given by d2–d1. Referring to the above, d2 can be adjusted by the implantation energy, and d1 can be adjusted by the first heat treatment. According to one embodiment, the implantation energy is selected from a range of between 220 keV and 6 MeV, in particular between 500 keV and 3 MeV. The temperature and the duration of the first heat treatment may be selected such that the depth d1 of the first region 110 is between 5 and 20 micrometers (μm). According to one embodiment, forming the second region 120 includes two or more implantation processes at different implantation energies so as to increase a width of the region where the second region 120 has a high (maximum) vacancy concentration.

The method further includes forming oxygen precipitates in the second region 120 by a second heat treatment. The formation of those oxygen precipitates requires interstitial oxygen, in particular, in a concentration of typically more than 5E17 cm$^{-3}$, and vacancies. These requirements are given in the second region 120. Referring to the above, the implantation of particles via the first surface may also create vacancies in the first region 110. However, by virtue of the first heat treatment the oxygen concentration in the first region 110 is below this critical oxygen concentration (5E17 cm$^{-3}$) at which oxygen precipitates may occur. In a region below the second region 120 that is, in a region more distant than the distance d2 to the first surface 101, the oxygen concentration may be higher than the critical oxygen concentration. However, in this region no additional vacancies are generated by implanting the particles. Therefore the number of vacancies in this region is significantly lower than in the region 120. FIG. 3 schematically illustrates the precipitate concentration $N_{PRE}$ in the second region 120.

A temperature in the second heat treatment is, for example, selected from a range of between 600° C. and 1050° C. A duration of the second heat treatment may be selected from a range of between 1 hour and 30 hours. According to one embodiment, the second heat treatment comprises heating at least the second region 120 to a temperature of between 750° C. and 850° C. for between 1 hour and 10 hours, and heating at least the second region to a temperature of between 950° C. and 1100° C. for between 10 hours and 20 hours.

If protons are used as particles for creating the vacancies, most of these protons diffuse out of the semiconductor wafer 100 in the second heat treatment. Further, the second heat treatment causes most of the vacancies generated in the first region 110 to diffuse out of the semiconductor wafer 100 or to recombine with silicon interstitials. That is, damages caused by the particle implantation in the first region 110 are "repaired".

In the semiconductor wafer 100 obtained after the first heat treatment, creating the vacancies, and the second heat treatment, semiconductor devices can be implemented in the first region 110, which is a denuded zone. The oxygen precipitates generated in the second region 120 act as gettering centers for gettering impurities that may be introduced into the semiconductor wafer 100 during process steps for implementing the semiconductor devices in the first region 110. In the method explained before, the depth d1 of the first region 110, as well as the position 120 can be precisely adjusted by adjusting the parameters (temperature and duration) of the first heat treatment, and the parameters of the particle implantation (in particular, the implantation energy). In this way, the second region 120 which includes the gettering centers can be generated close to the denuded zone in which semiconductor devices are implemented. According to one embodiment, the second heat treatment is part of producing the semiconductor devices. That is, after creating the vacancies by implanting the particles there are process steps which are part of forming the semiconductor devices before performing the second heat treatment. Those process steps may include implanting dopant atoms. In this case, the second heat treatment serves both, to generate the second region 120 and to activate the implanted dopant atoms.

The vacancies induced by the high energetic particle irradiation enable a high density of large oxygen precipitates because the vacancies enable a faster growth of the oxygen precipitates. That is, those oxygen precipitates generated in regions with a high vacancy concentration are larger than oxygen precipitates generated in regions without (or with a lower concentration of) vacancies. Those larger oxygen precipitates have a higher temperature stability than smaller oxygen precipitates generated without "vacancy support".

According to one embodiment, the oxygen concentration in the first region 110 is measured before the first heat treatment. Based on the measured oxygen concentration, at least one of the temperature and the duration of the first heat treatment is adjusted.

According to one embodiment, before the first heat treatment, interstitial silicon atoms are driven into the semiconductor wafer 100 from the first surface 101 in order to reduce a vacancy concentration or vacancy cluster concentration in the semiconductor wafer 100. A vacancy cluster may include COPs (crystal originated particles) or D-defects. Driving interstitial silicon atoms into the semiconductor wafer 100 may include an oxidation process in which a thermal oxide is produced on the first surface 101. A vertical cross sectional view of a section of the semiconductor wafer 100 after forming an oxide layer 21 on the first surface 101 is shown in FIG. 4. Forming the oxide layer 21 shown in FIG. 4 may include oxidizing the first surface 101 in a dry or wet oxidizing atmosphere.

The diagram additionally shown in FIG. 4 illustrates the vacancy concentration $N_{VAC}$ before driving the interstitial silicon into the wafer 100 (see the solid line in the diagram), and the vacancy concentration $N_{VAC}$ after driving the interstitial silicon into the wafer 100 (see the dotted line). As can be seen from FIG. 4, driving interstitial silicon into the semiconductor wafer 100 reduces the vacancy concentration in the wafer 100. Accordingly, vacancy clusters can be removed, in order to reduce their concentration, by driving interstitial silicon into the semiconductor wafer 100.

Referring to FIG. 5, the method may further include before the second heat treatment, creating vacancies in a third region 130 adjoining the second surface 102 of the semiconductor wafer 100. Generating these vacancies may include implanting particles via the second surface 102 into the semiconductor wafer 100. Additionally or alternatively to implanting particles, creating vacancies in the third region 130 may include a heat treatment of the semiconductor wafer 100 in a nitrogen ($N_2$) containing atmosphere. According to one embodiment, a duration of this heat treatment is selected from a range of between 5 seconds and 60 seconds, and a temperature is selected from a range of between 1000° C. and 1200° C., Optionally, a protection layer 22 is formed on the first surface 101 before this heat treatment in the nitrogen containing atmosphere. This protection layer is, for example, an oxide layer, and prevents vacancies from being generated in a region below the first surface 101 during the process in which vacancies are generated in the third region 130.

FIG. 6 shows a vertical cross sectional view of a section of the semiconductor wafer 100 after further process steps in which an epitaxial layer 200 is produced on the first surface 101. In this epitaxial layer 200 and the first region 101 below the epitaxial layer 200 active regions of semiconductor devices can be implemented. A thickness, which is a dimension of the epitaxial layer 200 in a vertical direction of the wafer 100 is, for example, between 3 micrometers and 10 micrometers.

In each of the methods explained herein before, after the method, there is a low concentration of oxygen precipitates in the first region 110, so that active regions of semiconductor devices can be formed therein, and a high concentration of oxygen precipitates in the second region 120, which acts as gettering regions. In a third region between the second region and the second surface there may be a concentration of oxygen precipitates which is higher than in the first region. However, the concentration of oxygen precipitates in the third region is lower than in the second region 120 because the third region, like the second region, includes oxygen but does not include such high vacancy concentrations as in the second region 120. For example, in the third region the vacancy concentration is lower than 1E14 cm$^{-3}$ or even lower than 1E13 cm$^{-3}$.

Ideally, the concentration of oxygen precipitates in the first region is zero. In the third region, the concentration of oxygen precipitates is different from zero. In general, if the oxygen concentration in the first region is slightly higher than zero, the minimum concentration of oxygen precipitates in the third region is at least 10 times the maximum concentration of oxygen precipitates in the first region 110. The minimum concentration of oxygen precipitates in the second region 120 is at least 3 times, at least 5 times, or at least 10 times the maximum concentration of oxygen precipitates in the third region.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
   reducing an oxygen concentration in a silicon wafer in a first region adjoining a first surface of the silicon wafer by a first heat treatment;
   creating vacancies in a crystal lattice of the wafer at least in a second region adjoining the first region by implanting particles via the first surface into the wafer; and
   forming oxygen precipitates in the second region by a second heat treatment.

2. The method of claim 1, wherein a temperature in the first heat treatment is higher than 1000° C.

3. The method of claim 1, wherein a duration of the first treatment is longer than 1 hour.

4. The method of claim 1, wherein a duration of the first treatment is longer than 4 hours.

5. The method of claim 1, further comprising:
   measuring the oxygen concentration in the first region before the first heat treatment; and
   adjusting at least one of a temperature in the first heat treatment, and a duration of the first heat treatment based on the measuring.

6. The method of claim 1, wherein the first heat treatment is configured to reduce the oxygen concentration in the first region to below 6E17 cm$^{-3}$.

7. The method of claim 1, wherein the first heat treatment is configured to reduce the oxygen concentration in the first region to below 5E17 cm$^{-3}$.

8. The method of claim 1, wherein the first heat treatment is adapted to form the first region with a depth of between 2-15 μm as seen from the first surface.

9. The method of claim 1, wherein the particles include at least one of protons and helium atoms.

10. The method of claim 1, wherein implanting the particles comprises implanting the particles at a dose of between 5E13 cm$^{-2}$ and 1E15 cm$^{-2}$.

11. The method of claim 1, wherein creating vacancies comprises generating vacancies in a concentration of between 1E17 cm$^{-3}$ and 1E19 cm$^{-3}$.

12. The method of claim 1, wherein a temperature in the second heat treatment is selected from a range of between 700° C. and 1050° C.

13. The method of claim 12, wherein a duration of the second heat treatment is between 1 hour and 30 hours.

14. The method of claim 13, wherein the second heat treatment comprises:
   heating at least the second region to a temperature of between 750° C. and 850° C. for between 1 hour and 10 hours, and
   heating at least the second region to a temperature of between 950° C. and 1100° C. for between 10 hours and 20 hours.

15. The method of claim 1, further comprising:
   creating vacancies in the crystal lattice of the wafer in a third region adjoining a second surface opposite the first surface before the second heat treatment.

16. The method of claim 15, wherein creating vacancies in the third region comprises at least one of implanting particles into the second surface, and subjecting the second surface to a heat treatment in a nitrogen containing atmosphere.

17. The method of claim 16, further comprising:
   forming a protection layer on the first surface before the heat treatment in the nitrogen containing atmosphere.

18. The method of claim 17, wherein the protection layer is an oxide layer.

19. The method of claim 1, further comprising:
   forming an epitaxial layer on the first surface.

20. The method of claim 1, further comprising:
   before forming the oxygen precipitates, forming nucleation seeds in the second region.

21. The method of claim 1, further comprising:
   before the first heat treatment, driving interstitial silicon atoms from the first surface into the silicon wafer.

22. The method of claim 21, wherein driving the interstitial atoms into the silicon wafer comprises forming an oxide on the first surface.

23. A semiconductor wafer comprising:
   a first surface;
   a first region, a second region, and a third region, wherein the first region adjoins the first surface, and
wherein the second region is between the first region and the third region,
wherein a minimum concentration of oxygen precipitates in the third region is higher than a maximum concentration of oxygen precipitates in the first region, and
wherein a minimum concentration of oxygen precipitates in the second region is higher than a maximum concentration of oxygen precipitates in the third region.

24. The semiconductor wafer of claim 23, wherein the minimum concentration of oxygen precipitates in the third region is at least 10 times the maximum concentration of oxygen precipitates in the first region.

25. The semiconductor wafer of claim 23, wherein the minimum concentration of oxygen precipitates in the second region is at least 3 times the maximum concentration of oxygen precipitates in the third region.

* * * * *